(12) United States Patent  
Takakusaki et al.

(10) Patent No.: US 7,999,190 B2  
(45) Date of Patent: Aug. 16, 2011

(54) LIGHT EMITTING MODULE AND METHOD FOR MANUFACTURING THE SAME

(75) Inventors: Sadamichi Takakusaki, Gunma (JP); Koichiro Ono, Tottori (JP); Akihisa Matsumoto, Tottori (JP)

(73) Assignees: Sanyo Electric Co., Ltd., Moriguchi-shi (JP); Sanyo Semiconductor Co., Ltd., Gunma (JP); Sanyo Consumer Electronics Co., Ltd., Tottori-shi (JP)

( * ) Notice: Subject to any disclaimer, the term of this patent is extended or adjusted under 35 U.S.C. 154(b) by 0 days.

(21) Appl. No.: 12/238,251

(22) Filed: Sep. 25, 2008

(65) Prior Publication Data

US 2009/0078455 A1    Mar. 26, 2009

(30) Foreign Application Priority Data

Sep. 25, 2007   (JP) ................................. 2007-247878

(51) Int. Cl.  
*H05K 1/16* (2006.01)

(52) U.S. Cl. .................... 174/260; 257/678; 363/373

(58) Field of Classification Search .................. 174/260; 257/678; 363/373  
See application file for complete search history.

(56) References Cited

U.S. PATENT DOCUMENTS

| | | | | |
|---|---|---|---|---|
| 2007/0170563 | A1* | 7/2007 | Chen | 257/678 |
| 2007/0195528 | A1* | 8/2007 | Wu | 362/249 |
| 2007/0290307 | A1* | 12/2007 | Lin | 257/678 |
| 2008/0084699 | A1* | 4/2008 | Park et al. | 362/373 |

FOREIGN PATENT DOCUMENTS

| | | |
|---|---|---|
| JP | 2006-100753 | 4/2006 |
| JP | 2006100753 A  * | 4/2006 |

\* cited by examiner

*Primary Examiner* — Yuriy Semenenko  
*Assistant Examiner* — Andargie M Aychillhum  
(74) *Attorney, Agent, or Firm* — Morrison & Foerster LLP

(57) ABSTRACT

Provided are: a light emitting module which has an improved heat-dissipating property and whose reflectance reduction is prevented. The light emitting module mainly includes: a metal substrate; a conductive pattern formed on the upper surface of the metal substrate; and a light emitting element disposed on the upper surface of the metal substrate and electrically connected to the conductive pattern. Furthermore, in the light emitting module, an insulating layer is removed in a region where the conductive pattern is not formed, but is left unremoved in a region right below (or covered with) the conductive pattern. In other words, in the region where the conductive pattern is not formed, the upper surface of the metal substrate is not covered with the conductive pattern, and a metal material constituting the metal substrate is exposed.

10 Claims, 12 Drawing Sheets

LIGHT EMITTING MODULE AND METHOD FOR MANUFACTURING THE SAME

This application claims priority from Japanese Patent Application Number JP 2007-247878 filed on Sep. 25, 2007, the content of which is incorporated herein by reference in its entirety.

BACKGROUND OF THE INVENTION

1. Field of the Invention

The present invention relates to a light emitting module and a method for manufacturing the light emitting module. Particularly, the present invention relates to: a light emitting module on which a high-luminance light emitting element is mounted; and a method for manufacturing the light emitting module.

2. Description of the Related Art

A semiconductor light emitting element represented by a light emitting diode (LED) has a long life and shows a high visibility. Accordingly, its use in traffic signals, lamps of automobiles, and the like, has been started. Moreover, use of an LED in lighting equipment is emerging.

When used in lighting equipment, a large number of LEDs are mounted in single lighting equipment, because merely a single LED cannot produce a sufficient brightness. However, an LED dissipates a large amount of heat during the light emission. Accordingly, when an LED is mounted on a mounting board made of a resin material that has an inferior heat-dissipating property, or when such individual LEDs are resin-packaged individually, heat is not desirably dissipated from the LED to the outside. Consequently, the performance of the LED is deteriorated soon.

Japanese Patent Application Publication No. 2006-100753 (JP-A 2006-100753) discloses a technology in which an LED is mounted on the upper surface of a metal substrate made of aluminum in order to desirably dissipating a heat generated from an LED to the outside. Particularly, with reference to FIG. 2 of JP-A 2006-100753, an upper surface of a metal substrate 11 is covered with an insulating resin 13, a conductive pattern 14 is formed on the upper surface of this insulating resin 13, and then a light emitting element 15 (LED) is mounted on the upper surface of the conductive pattern 14. With this configuration, the heat generated from the light emitting element 15 is dissipated outside via the conductive pattern 14, the insulating resin 13 and the metal substrate 11.

Nevertheless, in the technology described in JP-A 2006-100753, the layer of the insulating resin 13 covering the upper surface of the metal substrate 11 is exposed from the upper surface of the substrate. Meanwhile, when such an LED module is used, the upper surface of the substrate is irradiated with part of light emitted from the light emitting element 15. Accordingly, light emission from the light emitting element 15 over a long period causes discoloration and deterioration of the insulating resin 13, and consequently, the breakdown voltage of the insulating resin 13 is decreased.

SUMMARY OF THE INVENTION

The present invention has been made in view of the above-described problems. A main object of the present invention is to provide: a light emitting module which has an improved heat-dissipating property and is capable of preventing reflectance reduction; and a method for manufacturing the light emitting module.

A light emitting module according to the present invention includes: a circuit board including an insulating layer as an uppermost layer; a wiring layer formed on the upper surface of the insulating layer; and a light emitting element electrically connected to the wiring layer. The insulating layer is removed in a region where the wiring layer is not formed.

A method for manufacturing a light emitting module according to the present invention includes the steps of: forming a wiring layer on the upper surface of a substrate including an insulating layer as an uppermost layer; removing the insulating layer in a region where an upper surface of the insulating layer is not covered with the wiring layer; and electrically connecting a light emitting element to the wiring layer.

DESCRIPTION OF THE INVENTIONS

Figure 1A:
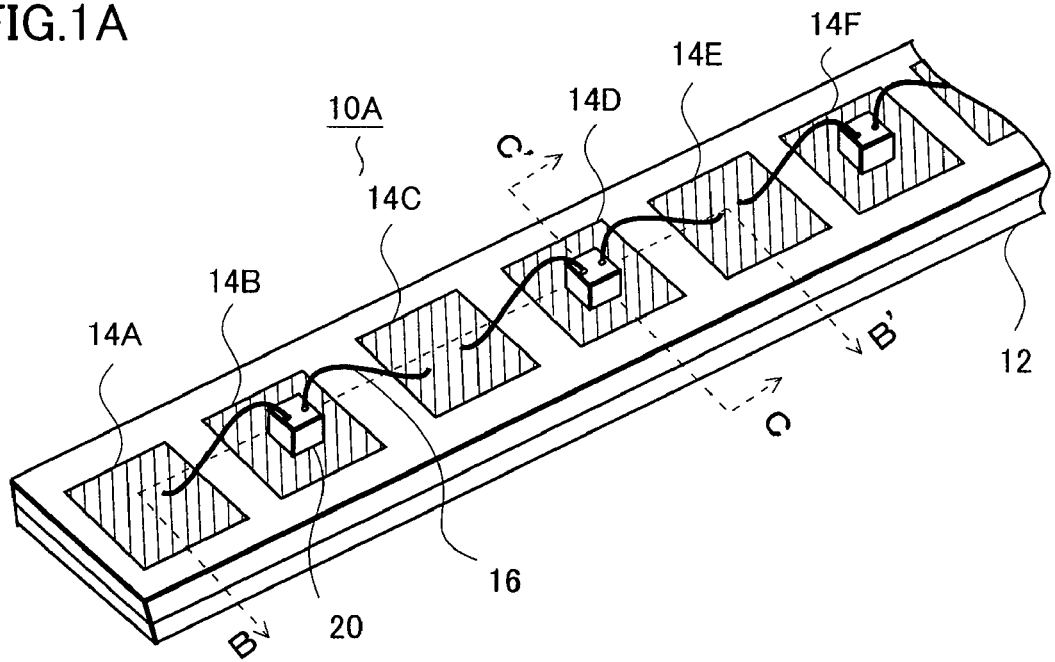
FIG. 1A is a perspective view and FIGS. 1B, 1C are cross-sectional views for showing a configuration of a light emitting module according to a preferred embodiment of the present invention.
Figure 1B:
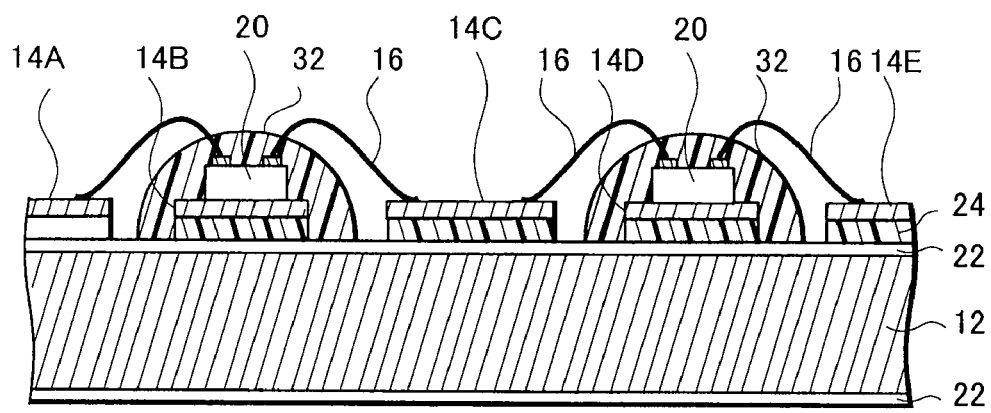
Figure 1C:
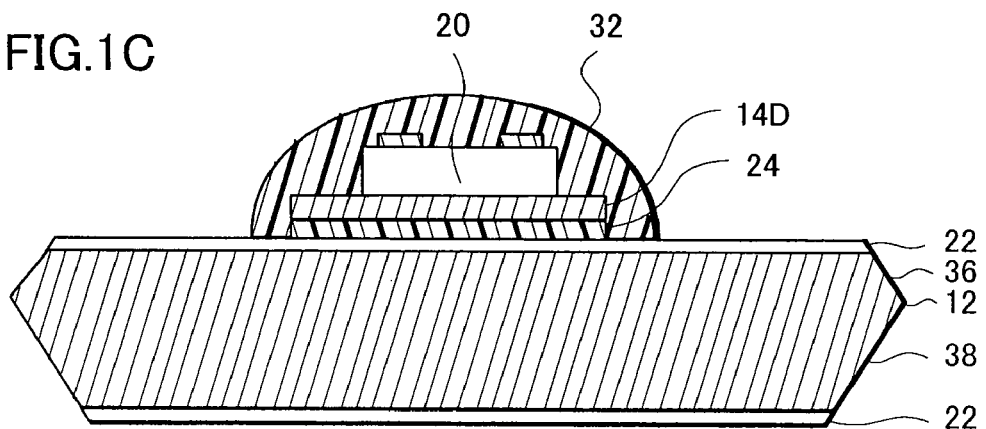

A configuration of a light emitting module 10A according to a preferred embodiment of the present invention will be described with reference to FIG. 1A to FIG. 1C. FIG. 1A is a perspective view of the light emitting module 10A. FIG. 1B is a cross-sectional view taken along the line B-B' in FIG. 1A. FIG. 1C is a cross-sectional view taken along the line C-C' in FIG. 1A.

As shown in these drawings, the light emitting module 10A mainly includes: a metal substrate 12; a conductive pattern 14 formed on the upper surface of the metal substrate 12; and a light emitting element 20 disposed above the upper surface of the metal substrate 12 and electrically connected to the conductive pattern 14. Hereinafter, conductive patterns 14A to 14F may be collectively termed as the conductive pattern 14.

When FIG. 1A is referred to, the light emitting module 10A has a number of light emitting elements 20 mounted above the upper surface of the single plate-like metal substrate 12. These light emitting elements 20 are connected to each other in series via the conductive patterns 14 and thin metal wires 16. By supplying a direct current to the light emitting module 10A having such a configuration, a predetermined color of light is emitted from the light emitting element 20. Thus, the light emitting module 10A functions as lighting equipment like a fluorescent lamp, for example.

The metal substrate 12 (circuit board) is a substrate made of a metal such as copper (Cu) or aluminium (Al). The metal substrate 12 has a thickness of approximately 0.5 mm to 2.0 mm, a width of approximately 5 mm to 20 mm, and a length of approximately 10 cm to 50 cm, for example. When the metal substrate 12 is made of aluminium, the upper surface and the lower surface of the metal substrate 12 are covered with an oxide film 22 (alumite film: $Al_2O_3$) obtained by anodizing aluminium. As shown in FIG. 1B, the thickness of the oxide film 22 covering the metal substrate 12 is, for example, approximately 1 μm to 10 μm. Furthermore, in order to secure a predetermined amount of light to be produced, the multiple light emitting elements 20 are arranged in a line so that the metal substrate 12 can have a considerably thin and narrow form. At each of the two ends in a longitudinal direction of the metal substrate 12, an external connection terminal to be connected to a power source on the outside is formed. This external connection terminal may be an insertion-type connector, or may be formed by soldering a wire to the conductive pattern 14.

As shown in FIG. 1C, side surfaces of the metal substrate 12 are formed so as to protrude outwards. Specifically, each of the side surfaces of the metal substrate 12 is formed by: a first inclined portion 36 that continuously inclines outwards from the upper surface of the metal substrate 12; and a second inclined portion 38 that continuously inclines outwards from the lower surface of the metal substrate 12. This configuration makes it possible to have large areas of the side surfaces of the metal substrate 12 in comparison with a configuration where a metal substrate 12 has vertical side surfaces, and thus to increase the amount of heat dissipated from the side surfaces of the metal substrate 12 to the outside. Particularly, the side surfaces of the metal substrate 12 are not covered with the oxide film 22 having a high thermal resistance, and a metal material superior in a heat-dissipating property is exposed from the side surfaces. Thus, with this configuration, the heat-dissipating property of the entire module is improved.

As shown in FIG. 1B, the upper surface of the metal substrate 12 is partially covered with an insulating layer 24 made of a resin in which fillers such as $Al_2O_3$ are mixed. The thickness of the insulating layer 24 is, for example, approximately 50 μm. The insulating layer 24 has a function to insulate the metal substrate 12 and the conductive pattern 14 from each other. Moreover, the insulating layer 24 has a large amount of fillers mixed therein. This enables the thermal expansion coefficient of the insulating layer 24 to be closer to those of the metal substrate 12 and the conductive pattern 14, and also reduces the thermal resistance of the insulating layer 24. For example, the insulating layer 24 contains the approximately 70 to 80 volume % of fillers, and the average particle diameter of the fillers contained therein is approximately 4 μm.

As shown in FIGS. 1A and 1B, the conductive pattern 14 (wiring layer) is formed on the upper surface of the insulating layer 24, and functions as part of a pathway for conducting electricity to each light emitting element 20. The conductive pattern 14 is formed by etching a conductive foil made of copper or the like that is disposed on the upper surface of the insulating layer 24. Furthermore, the conductive patterns 14 provided at the two ends of the metal substrate 12 may function, in some cases, as external connection terminals contributing to the connection to the outside.

Particularly, as shown in FIG. 1A, the conductive patterns 14A, 14C, 14E function as bonding pads to which the thin metal wires 16 are connected. The conductive patterns 14B, 14D, 14F function as die pads to which upper surfaces the light emitting elements 20 are fixedly attached.

The light emitting element 20 includes two electrodes (anode, cathode) on the upper surface thereof. The light emitting element 20 is a semiconductor element that emits light of a predetermined color. The light emitting element 20 has a structure in which an N type semiconductor layer and a P type semiconductor layer are stacked on the upper surface of a semiconductor substrate made of gallium arsenide (GaAs) or the like. The specific size of the light emitting element 20 is: for example, approximately 0.3 mm to 1.0 mm in length, 0.3 mm to 1.0 mm in width, and 0.1 mm in thickness. Moreover, the thickness of the light emitting element 20 varies depending on the color of light to be emitted. For example, the thickness of the light emitting element 20 that emits a red light is approximately 100 μm to 3000 μm. The thickness of the light emitting element 20 that emits a green light is approximately 100 μm. The thickness of the light emitting element 20 that emits a blue light is approximately 100 μm. When a voltage is applied to the light emitting element 20, light is emitted from the upper surface and top portions of side surfaces. The configuration of the light emitting module 10A according to the preferred embodiment of the present invention has a superior heat-dissipating property, and therefore is particularly effective on the light emitting element 20 (power LED) through which a current of 100 mA or more passes, for example.

Herein, by fixedly attaching, above the upper surface of the metal substrate 12, the above-described multiple light emitting elements 20 that emit lights of three colors (red, green and blue: RGB), a white light may be emitted as a whole. Alternatively, the same color (any of RGB colors) of light may be emitted from all the light emitting elements 20.

Furthermore, the two electrodes (anode, cathode) are disposed on the upper surface of the light emitting element 20. These electrodes are connected to the conductive patterns 14 via the thin metal wires 16. Here, each connecting portion between the electrode of the light emitting element 20 and the thin metal wire 16 is covered with a sealing resin 32. Still furthermore, as shown in FIG. 1B, the light emitting elements 20 are fixedly attached to the upper surfaces of the conductive patterns 14B, 14D with a fixing material (for example, solder or an insulating adhesive). Additionally, the light emitting element 20 may be fixedly attached directly to the upper surface of the metal substrate 12 instead of the upper surface of the conductive pattern 14B or the like.

The sealing resin 32 is formed by mixing a fluorescent material into a silicone resin superior in thermal resistance. The sealing resin 32 is formed on the upper surface of the metal substrate 12 so as to cover the light emitting element 20. For example, when a blue light is emitted from the light emitting element 20 and a yellow fluorescent material is mixed in the sealing resin 32, the light transmitted through the sealing resin 32 turns white. In this manner, it is possible to utilize the light emitting module 10A as lighting equipment that emits a white light.

As shown in FIGS. 1B and 1C, in the light emitting module 10A, a portion of the insulating layer 24, on which the conductive pattern 14 is not formed, is removed. Meanwhile, a portion of the insulating layer 24 below the conductive pattern 14 is left unremoved. Specifically, since the insulating layer 24 is made of the resin extensively filled with fillers, if the insulating layer 24 is irradiated with light emitted from the light emitting element 20 in long-time use, the resin component of the insulating layer 24 may be deteriorated to reduce the breakdown voltage of the insulating layer 24. For this reason, in this embodiment, only the portion of the insulating layer 24 whose upper surface is covered with the conductive pattern 14 is left unremoved. Meanwhile the other portion of the insulating layer 24 is removed. Thereby, the upper surface of the remaining insulating layer 24 is covered with the conductive pattern 14. Accordingly, the insulating layer 24 is not irradiated with light emitted from the light emitting element 20 and, therefore the deterioration of the insulating layer 24 is suppressed. Meanwhile, in the portion where the insulating layer 24 is removed, the upper surface of the metal substrate 12 made of the metal material is exposed. Even when the upper surface of the metal substrate 12 is irradiated with light emitted from the light emitting element 20, however, the metal substrate 12 is not deteriorated.

As shown in FIG. 1B, in the portion where the insulating layer 24 is removed, the oxide film 22 is exposed from the upper surface of the metal substrate 12. Nevertheless, the oxide film 22 that is made of an inorganic material is hardly deteriorated by the irradiation of light emitted from the light emitting element 20. Meanwhile, by leaving the oxide film 22 on the upper surface of the metal substrate 12 in the portion where the insulating layer 24 is removed, the sealing resin 32 is firmly adhered to a coarse surface of the oxide film 22, because the upper surface of the oxide film 22 is coarser than the surface of the metal material constituting the metal substrate 12.

Furthermore, a side surface of the remaining insulating layer 24 and a side surface of the conductive pattern 14 (for example, the conductive pattern 14C) are placed in the same plane. However, the side surfaces of the insulating layer 24 may be located in inner positions of the light emitting module 10A relative to the side surfaces of the conductive pattern 14C. This configuration restrains light emitted from the light emitting element 20 from reaching the insulating layer 24. Thus, the deterioration of the insulating layer 24 due to this light is further suppressed.

Figure 2A:
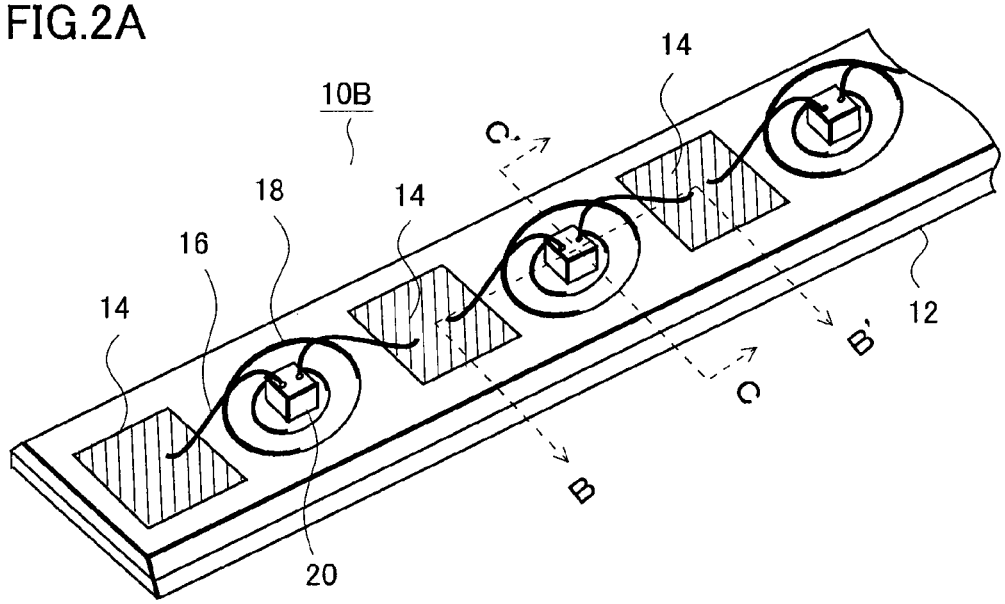
FIG. 2A is a perspective view and FIGS. 2B, 2C are cross-sectional views for showing a configuration of a light emitting module according to another preferred embodiment of the present invention.
Figure 2B:
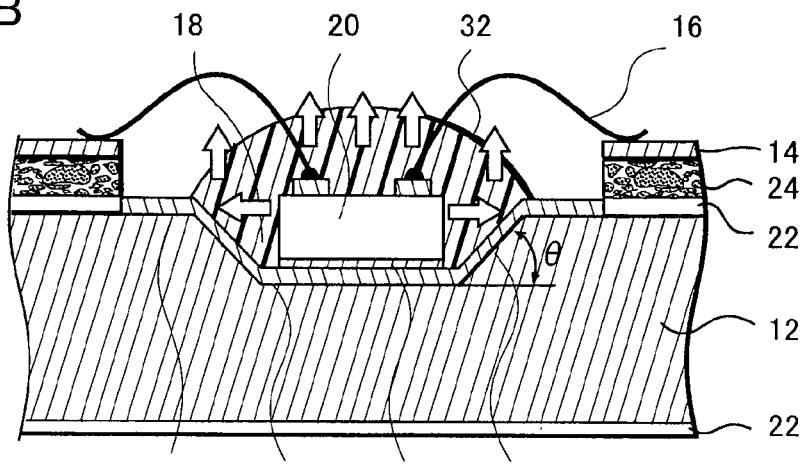
Figure 2C:
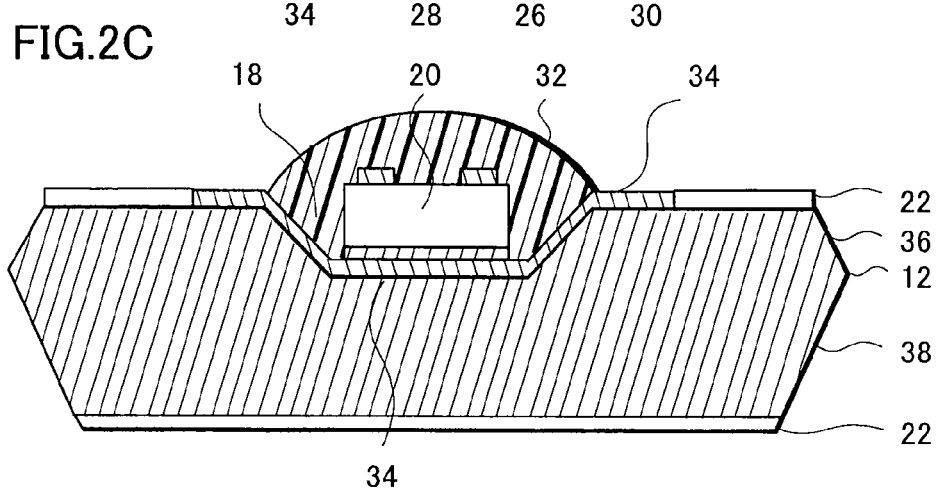

A configuration of a light emitting module 10B according to another embodiment will be described with reference to FIG. 2A to FIG. 2C. FIG. 2A is a perspective view of the light emitting module 10B. FIG. 2B is a cross-sectional view taken along the line B-B' in FIG. 2A. FIG. 2C is a cross-sectional view taken along the line C-C' in FIG. 2A.

The configuration of the light emitting module 10B shown in these drawings is basically the same as that of the light emitting module 10A described with reference to FIG. 1A to FIG. 1C. The difference is that a light emitting element 20 is mounted in a concave portion 18 formed in the upper surface of a metal substrate 12. Description will be given of the configuration of the light emitting module 10B, focusing on this difference.

With reference to FIG. 2B and FIG. 2C, firstly, by denting the upper surface of the metal substrate 12, the concave portion 18 is formed. The light emitting element 20 is fixedly attached to a bottom surface 28 of this concave portion 18. Furthermore, the light emitting element 20 is covered with a sealing resin 32 filled in the concave portion 18 and an opening portion 48.

The concave portion 18 is formed in the metal substrate 12 by denting the upper surface, and the bottom surface 28 has a circular shape. Moreover, a side surface of the concave portion 18 functions as a reflector for reflecting light upward, the light having been emitted sideways from the side surfaces of the light emitting element 20. The outer side of the side surface 30 and the bottom surface 28 form an angle θ of approximately 40° to 60°, for example. The depth of the concave portion 18 may be greater or smaller than the thickness of the light emitting element 20. For example, when the thickness of the concave portion 18 is set to be greater than a length equivalent to the thickness obtained by adding the thickness of the light emitting element 20 and that of a bonding material 26, the light emitting element 20 can be accommodated in the concave portion 18, and the upper surface of the light emitting element 20 can be positioned lower than the upper surface of the metal substrate 12.

In FIG. 2B, light emitted from the light emitting element 20 is indicated by white arrows. The light emitted from the upper surface of the light emitting element 20 is irradiated upward without interference. Meanwhile, light emitted sideways from the side surfaces of the light emitting element 20 reflects upward on a side surface 30 of the concave portion 18. Furthermore, since the light emitting element 20 is covered with the sealing resin 32 in which a fluorescent material is mixed, the light emitted from the light emitting element 20 transmits through the sealing resin 32 and is emitted to the outside.

The bottom surface 28 and the side surface 30 of the concave portion 18 as well as the upper surface of the metal substrate 12 near the concave portion 18 are covered with a cover layer 34. As a material of the cover layer 34, used is gold (Au) or silver (Ag) formed by a plating process. In addition, when a material (for example, gold or silver) that has a higher reflectance than the material of the metal substrate 12 is used as the material of the cover layer 34, the light emitted from the light emitting element 20 sideways can be reflected upward more efficiently. Moreover, the cover layer 34 has a function to prevent the inner wall of the concave portion 18, on which the metal is exposed, from being oxidized in a manufacturing process of the light emitting module.

Furthermore, on the bottom surface 28 of the concave portion 18, an oxide film 22 that covers the surface of the metal substrate 12 is removed. The oxide film 22 has a high thermal resistance in comparison with the metal that constitutes the metal substrate 12. Thus, by removing the oxide film 22 from the bottom surface 28 of the concave portion 18 on which the light emitting element 20 is mounted, the thermal resistance of the entire metal substrate 12 is reduced.

The bonding material 26 has a function to bond a lower surface of the light emitting element 20 and the concave portion 18. Since the light emitting element 20 does not have an electrode on the lower surface thereof, the bonding material 26 may be formed of a resin with an insulating property or may be formed of a metal such as solder, to improve the heat-dissipating property. Meanwhile, since the bottom surface 28 of the concave portion 18 is covered with a plating film (cover layer 34) made of silver or the like and superior in solder wettability, it is possible to employ solder as the bonding material 26 readily.

The light emitting module 10B is advantageous in that mounting the bare light emitting element 20 on the upper surface of the metal substrate 12 causes the heat generated from the light emitting element 20 to be dissipated to the outside in a significantly efficient manner. To be more specific, in the above-described background art, the light emitting element is mounted on the conductive pattern formed on the upper surface of the insulating layer, and accordingly the insulating layer inhibits the thermal conductivity. This makes it difficult to dissipate the heat from the light emitting element 20 to the outside efficiently. On the other hand, in the preferred embodiment of the present invention, the insulating layer 24 and the oxide film 22 are removed in the region where the light emitting element 20 is to be mounted, and the light emitting element 20 is fixedly attached to the surface of the metal substrate 12. Thereby, heat generated from the light emitting element 20 is immediately conducted to the metal substrate 12, and dissipated to the outside. Thus, the rising of the temperature of the light emitting element 20 is suppressed. Moreover, by the suppression of the temperature rising, the deterioration of the sealing resin 32 is also suppressed.

Furthermore, in the light emitting module 10B, the side surface 30 of the concave portion 18 provided in the upper surface of the metal substrate 12 can be utilized as the reflector. Specifically, as shown in FIG. 2B, the side surface 30 of the concave portion 18 is an inclined surface such that the width of the concave portion is gradually increased toward the upper surface of the metal substrate 12. This side surface 30 thus reflects light emitted sideways from the side surface of the light emitting element 20 to guide the irradiation of the light upward. In other words, the side surface 30 of the concave portion 18 accommodating the light emitting element 20 also functions as the reflector. This eliminates the need to independently prepare a reflector as in a generally-used light emitting module, thereby reducing the number of components as well as the production cost. Additionally, by covering the side surface 30 of the concave portion 18 with the material having a higher reflectance as described above, the function of the side surface 30 as the reflector can be enhanced.

Figure 3:
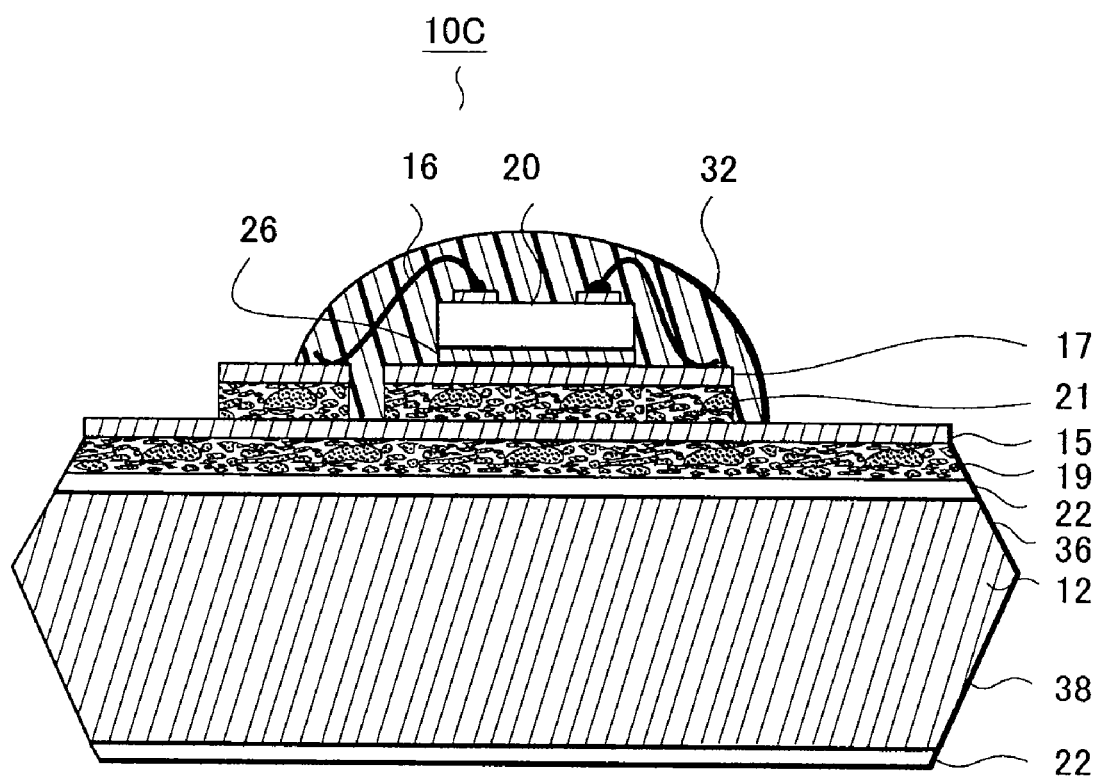
FIG. 3 is a cross-sectional view for showing a configuration of a light emitting module according to another preferred embodiment of the present invention.

A configuration of a light emitting module 10C according to another embodiment will be described with reference to a cross-sectional view of FIG. 3. The basic configuration of the light emitting module 10C is the same as that of the light emitting module 10A described above. The difference is that multiple wiring layers are formed above the upper surface of a metal substrate 12.

To be more specific, the upper surface of the metal substrate 12 is covered with a first insulating layer 19. On the upper surface of the first insulating layer 19, a first wiring layer 15 is formed. Then, the upper surface of the first wiring layer 15 is covered with a second insulating layer 21. On the upper surface of the second insulating layer 21, a second wiring layer 17 is formed.

Here, the above-described first insulating layer 19 and second insulating layer 21 are made of resins extensively filled with fillers, and the specific configuration thereof may be the same as that of the insulating layer 24 described above. Furthermore, the first wiring layer 15 and the second wiring layer 17 are formed by etching conductive foils made of copper that has a thickness of approximately 50 μm to 100 μm, for example.

The first wiring layer 15 is an unpatterned wiring layer on which no patterning is performed. The first wiring layer 15 covers the entire upper surface of the first insulating layer 19. By forming the first wiring layer 15 with such a configuration, the upper surface of the first insulating layer 19 is entirely covered with the first wiring layer 15. Accordingly, light emitted from a light emitting element 20 does not reach the first insulating layer 19, and the deterioration of the first insulating layer 19 is thus prevented. Furthermore, the area of the unpatterned first wiring layer 15 is larger than that of the second wiring layer 17 of being a higher layer. Thus, heat generated from the light emitting element 20 is spread in a larger area by the first wiring layer 15 after conducting through the second wiring layer 17 and the second insulating layer 21. Then, the heat is dissipated to the outside via the first insulating layer 19 and the metal substrate 12. Thus, since the heat path from the first wiring layer 15 is expanded, the heat-dissipating property of the entire module is improved and overheat of the light emitting element 20 is suppressed.

Here, the second wiring layer 17 forms: a die pad on which the light emitting element 20 is mounted; and a bonding pad to which a thin metal wire 16 is connected. A portion of the second insulating layer 21 where the second wiring layer 17 is formed on the upper surface thereof is left unremoved. Meanwhile, a portion of the second insulating layer 21, on which the second wiring layer 17 is not formed, is removed. In the region where the second wiring layer 17 is removed, the upper surface of the first wiring layer 15 of being a lower layer is exposed. Here, as described above, the side surfaces of the second insulating layer 21 may be disposed in inner positions relative to the side surfaces of the second wiring layer 17. With such a configuration, the second insulating layer 21 is not irradiated with light emitted from the light emitting element 20. This prevents light emitted from the light emitting element 20 from deteriorating the second insulating layer 21.

Figure 4:
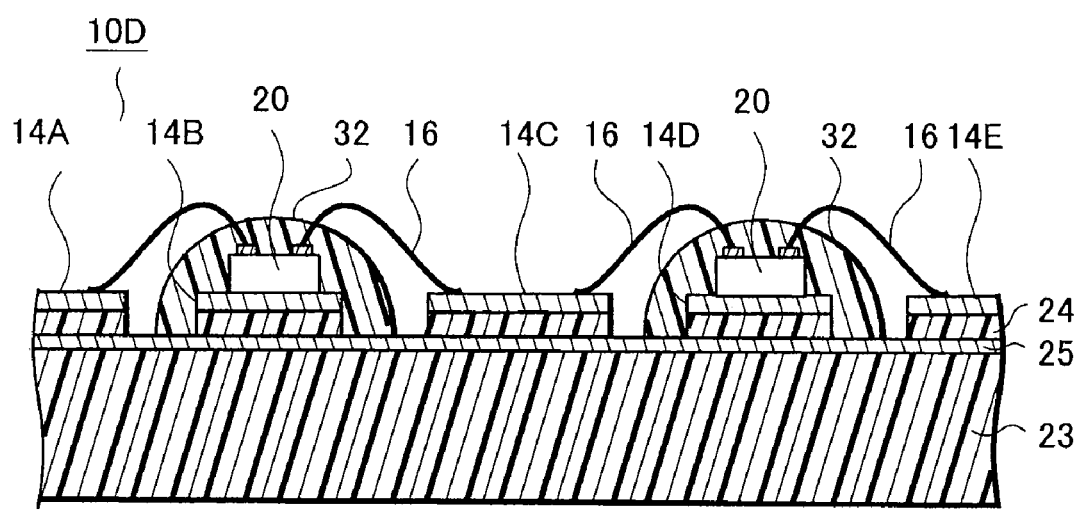
FIG. 4 is a cross-sectional view for showing a configuration of a light emitting module according to another preferred embodiment of the present invention.

Next, a configuration of a light emitting module 10D according to another embodiment will be described with reference to FIG. 4. The configuration of the light emitting module 10D is basically the same as that of the light emitting module 10A shown in FIG. 1A to FIG. 1C. The difference is that a resin substrate 23 made of a material mainly including a resin such as a glass epoxy is used as the substrate of the light emitting module 10D.

Here, the resin substrate 23 has a thickness of approximately 0.5 mm to 2.0 mm, for example. The upper surface of the resin substrate 23 is entirely covered with a metal layer 25. The metal layer 25 is a metal film made of mainly aluminium or copper, and the thickness thereof is approximately 50 μm to 100 μm. On the upper surface of the metal layer 25, conductive patterns 14A and the like are formed with insulating layers 24 interposed therebetween. Additionally, light emitting elements 20 are mounted on the upper surfaces of conductive patterns 14B, 14D. The conductive patterns 14A, 14C and 14E are electrically connected to the light emitting elements 20 via thin metal wires 16.

In the light emitting module 10D with the above-described configuration, firstly, portions of the insulating layer 24, on which the conductive patterns 14A and the like are not formed, are removed. Meanwhile, only portions of the insulating layer 24 on which the conductive patterns 14A and the like are formed are left unremoved. Thus, the deterioration of the insulating layer 24 due to light emitted from the light emitting elements 20 is suppressed.

Furthermore, the upper surface of the resin substrate 23 made of the material including a resin as the main component is covered with the metal layer 25. Accordingly, light emitted from the light emitting element 20 does not reach the upper surface of the resin substrate 23. Thus, the resin substrate 23 is prevented from deteriorating due to the light emitted from the light emitting element 20.

Hereinafter, a method for manufacturing a light emitting module with the above-described configuration will be described with reference to FIG. 5A to FIG. 12B. Herein, as a representative example, described will be a method for manufacturing a light emitting module 10B whose configuration is shown in FIGS. 2A to 2C.

First Step: See FIG. 5A to FIG. 6D

As shown in FIG. 5A to FIG. 6D, firstly, a substrate 40 that is a base member for a light emitting module 10B is prepared, and a conductive pattern is formed thereon. Then, an insulating layer 42 is partially removed. FIGS. 5A to 5D show that a single wiring layer (conductive pattern) is formed. FIGS. 6A to 6D show that multiple wiring layers are formed.

Figure 5A:
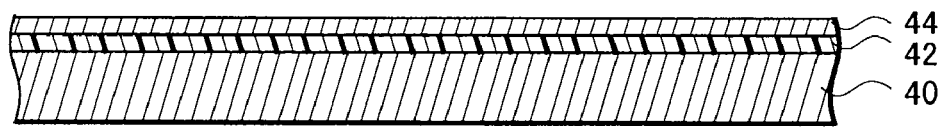
FIGS. 5A to 5C are cross-sectional views.

Refer to FIG. 5A. At first, the prepared substrate 40 is made of a metal that has, for example, copper or aluminium as a main material. The substrate 40 has a thickness of approximately 0.5 mm to 2.0 mm. The planar size of the substrate 40 is, for example, approximately 1 m×1 m, and the single substrate 40 produces multiple light emitting modules. When the substrate 40 is made of aluminium, the upper surface and the lower surface of the substrate 40 are covered with an anodized film as described above.

The upper surface of the substrate 40 is entirely covered with an insulating layer 42 having a thickness of approximately 50 μm. The composition of the insulating layer 42 is the same as that of the above-described insulating layer 24. The insulating layer 42 is accordingly made of a resin material extensively filled with fillers. Moreover, on the entire upper surface of the insulating layer 42, a conductive foil 44 made of copper having a thickness of approximately 50 μm is formed.

Figure 5B:
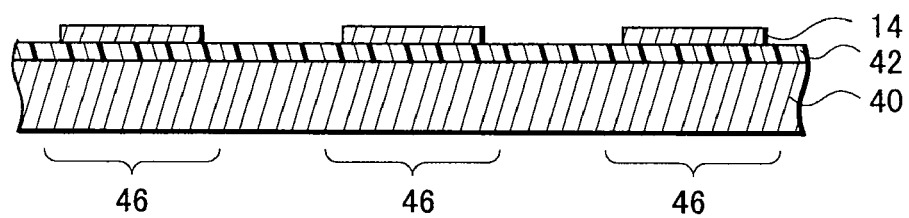

Then, as shown in FIG. 5B, the conductive foil 44 is patterned by selectively performing wet etching to form conductive patterns 14. Units 46 provided to the substrate 40 each have the same pattern of the conductive patterns 14. Herein, each unit 46 is a portion that constitutes a single light emitting module.

Figure 5C:
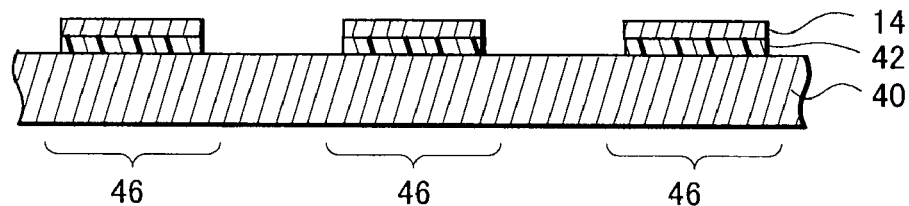

Subsequently, as shown in FIG. 5C, portions of the insulating layer 42 are removed except for portions below the conductive patterns 14. The insulating layer 42 is removed by laser irradiation or etching from top. When the etching is performed thereon, the insulating layer 42 is removed by wet etching by use of an etchant exerting a higher etching rate when etching a resin material constituting the insulating layer 42, than when etching the conductive patterns 14. Meanwhile, when the laser irradiation is performed thereon, the insulating layer 42 is removed by irradiating a carbon dioxide laser beam or a YAG laser beam from top. In this respect, when the insulating layer 42 is removed by the laser irradiation, an oxide film (for example, an oxide film 22 shown in FIGS. 1A to 1C) covering the upper surface of the substrate 40 may be removed together with the insulating layer 42. Moreover, regardless of whether the insulating layer 42 is removed by etching or laser irradiation, the conductive pattern 14 can be used as an etching mask.

Furthermore, by over-etching the insulating layer 42 using the conductive pattern 14 as the mask, side surfaces of the insulating layer 42 can be located in inner positions relative to side surfaces of the conductive pattern 14.

Figure 5D:
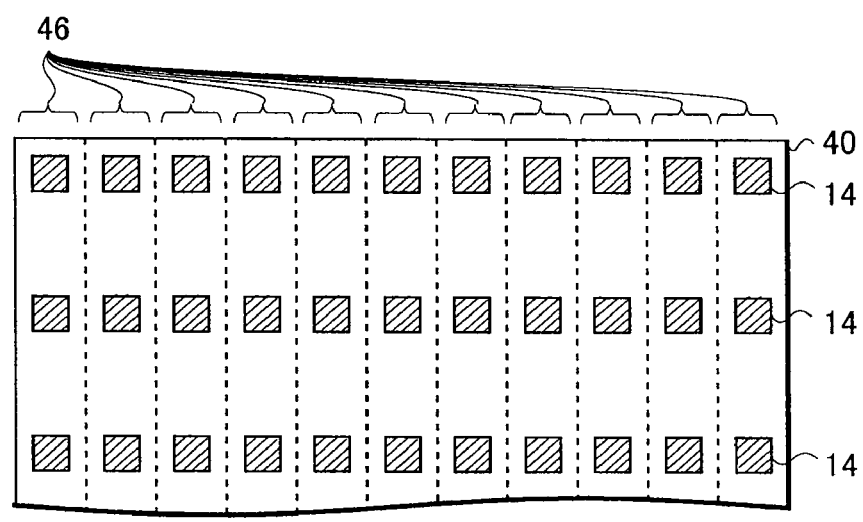
FIG. 5D is a plan view, for illustrating a method for manufacturing a light emitting module according to a preferred embodiment of the present invention.

FIG. 5D shows a plan view of the substrate 40 after the completion of this step. Here, each boundary between the adjacent units 46 is indicated by a dotted line. The unit 46 is, for example, approximately 30 cm in length and 0.5 cm in width, and has a considerably thin and narrow form.

Hereinbelow, a method of forming multiple wiring layers in this step will be described with reference to FIGS. 6A to 6C.

Figure 6A:
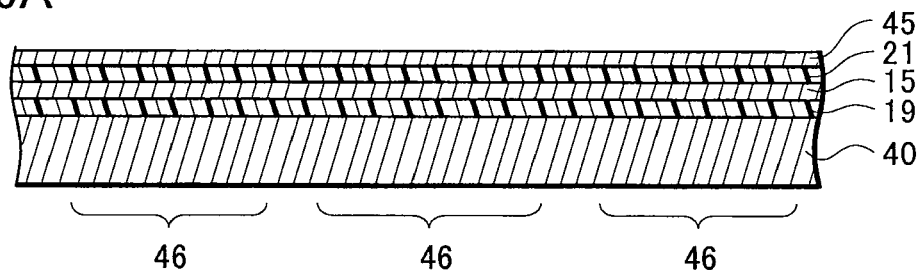
FIGS. 6A to 6C are cross-sectional views.

As shown in FIG. 6A, firstly, multiple wiring layers are formed above the upper surface of a substrate 40. Specifically, the upper surface of the substrate 40 is covered with a first insulating layer 19. On the upper surface of the first insulating layer 19, a first wiring layer 15 is formed. The first wiring layer 15 is covered with a second insulating layer 21, and a conductive foil 45 is attached to the upper surface of the second insulating layer 21. Here, the first wiring layer 15 may be in an unpatterned state where no patterning is performed thereon. Alternatively, a portion of the first wiring layer 15, which corresponds to a boundary between each of the adjacent units 46, may be removed by etching in order to facilitate a later step of separating units 46.

Figure 6B:
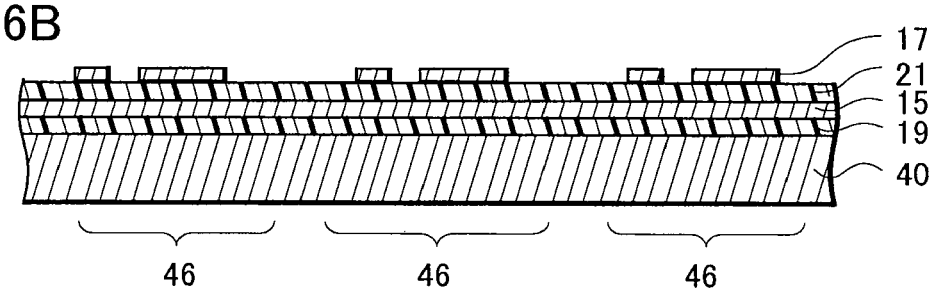

Then, as shown in FIG. 6B, the conductive foil 45 that is the uppermost layer is patterned by wet etching, and second wiring layers 17 are thus formed. The second wiring layer 17 includes: a die pad on which a light emitting element is mounted in a later step; and a bonding pad to which a thin metal wire is connected. Units 46 each have the same pattern as shown in FIG. 6D.

Figure 6C:
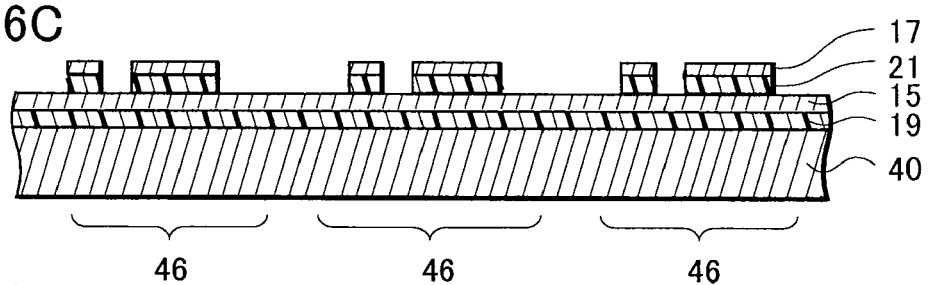
Figure 6D:
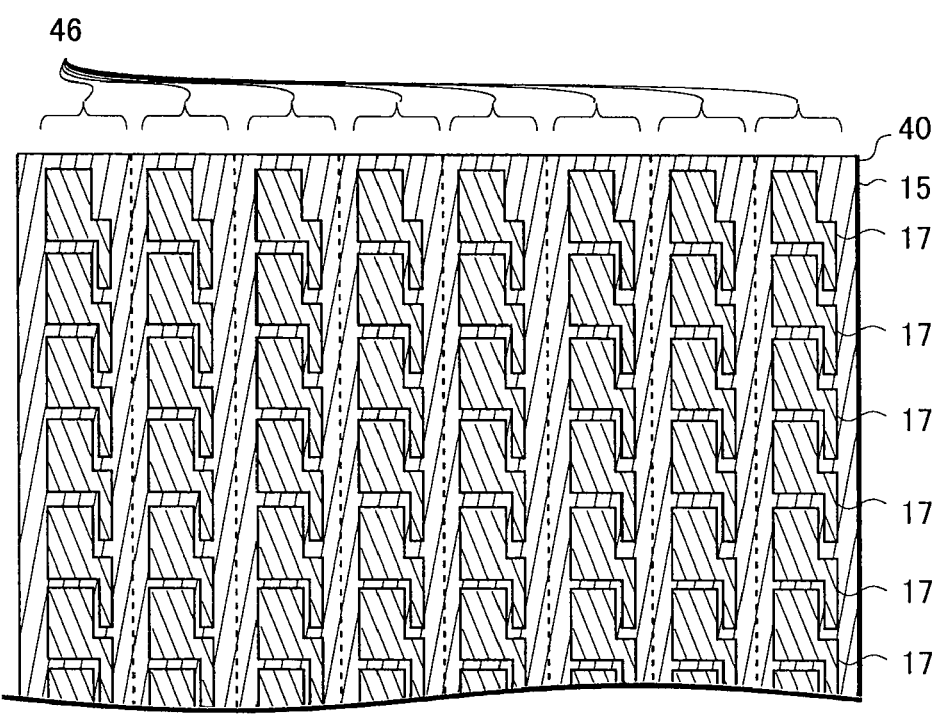
FIG. 6D is a plan view, for illustrating the method for manufacturing a light emitting module according to the preferred embodiment of the present invention.

Subsequently, as shown in FIG. 6C, portions of the second insulating layer 21 are removed except for portions where the second wiring layers 17 are formed on the second insulating layer 21. The way of removing the second insulating layer 21 is the same as that described with reference to FIG. 5C. In this case also, edge portions (side surfaces) of the second insulating layer 21 can be located in inner positions relative to edge portions (side surfaces) of the second wiring layer 17 by over-etching the second insulating layer 21.

Figure 7A:
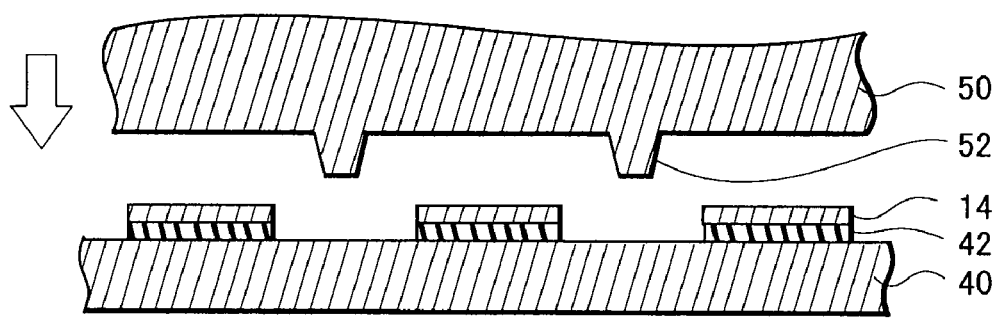
FIGS. 7A and 7B are cross-sectional views.
Figure 7B:
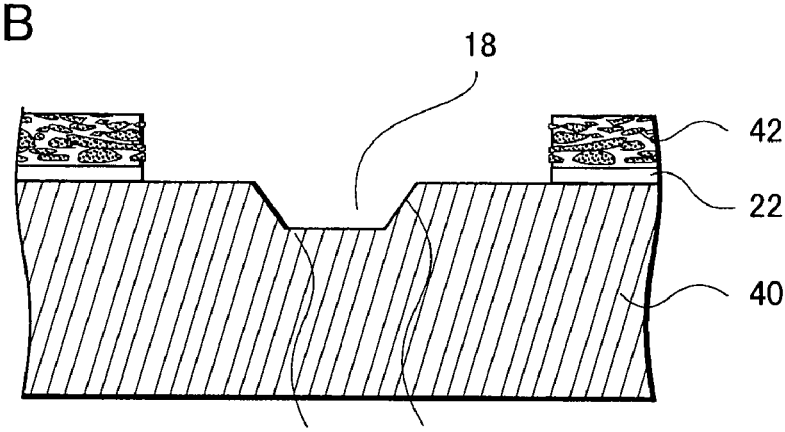
Figure 7C:
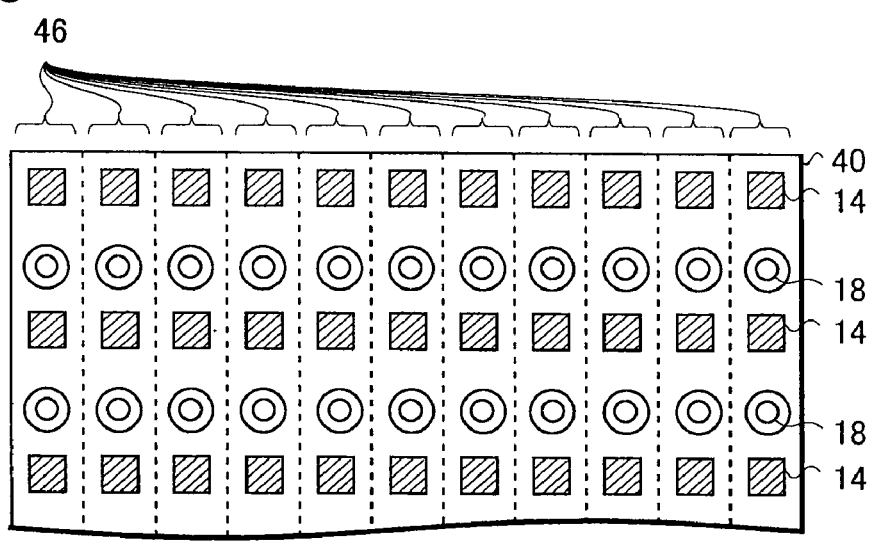
FIG. 7C is a plan view, for illustrating the method for manufacturing a light emitting module according to the preferred embodiment of the present invention.

Second Step: FIG. 7A to FIG. 7C

Next, as shown in FIG. 7A to FIG. 7C, concave portions 18 are formed in the upper surface of the substrate 40 in a region where the substrate 40 is not covered with the insulating layers 42. The concave portions 18 may be formed by selective etching, drilling, pressing, or other processes. Hereinbelow, described will be a method of forming the concave portions 18 by the pressing process.

As shown in FIG. 7A, firstly, a mold for the pressing is prepared. A mold 50 has multiple convex portions 52 formed thereon. Each convex portion 52 is shaped so as to correspond to a concave portion 18 to be formed. The convex portion 52 is shaped like a truncated cone. As the mold 50 is pressed downward, the upper surface of the substrate 40 is pressed by each convex portion 52 of the mold 50, and thereby the concave portion 18 is formed.

FIG. 7B shows the shape of the concave portion 18 thus formed. By the pressing process, the concave portion 18 is formed, which has a circular bottom surface 28 and an inclined side surface 30. Moreover, the depth of the concave portion 18 thus formed may be so deep that the light emitting element to be mounted in the later step is completely accommodated therein, or that the light emitting element is partially accommodated therein. Specifically, the depth of the concave portion 18 is, for example, approximately 100 μm to 300 μm.

As shown in FIG. 7C, in the regions of each unit 46 where the light emitting elements are to be mounted, the concave portions 18 are formed by the method described above.

This step will be omitted when the concave portions 18 are not formed in the upper surface of the metal surface 12 (for example, when a light emitting module 10A having the above-described configuration shown in FIG. 1 is manufactured).

Third Step: See FIG. 8A and FIG. 8B

Figure 8A:
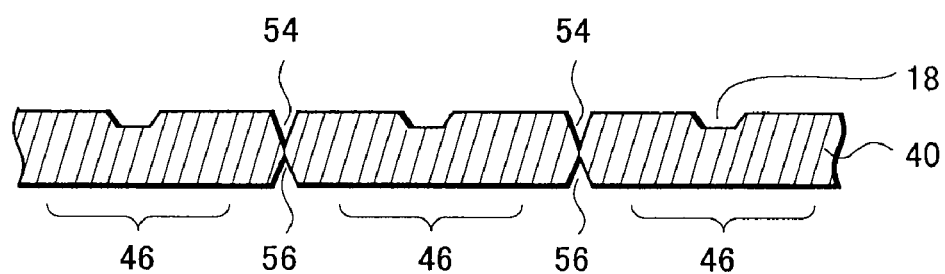
FIG. 8A is a cross-sectional view.
Figure 8B:
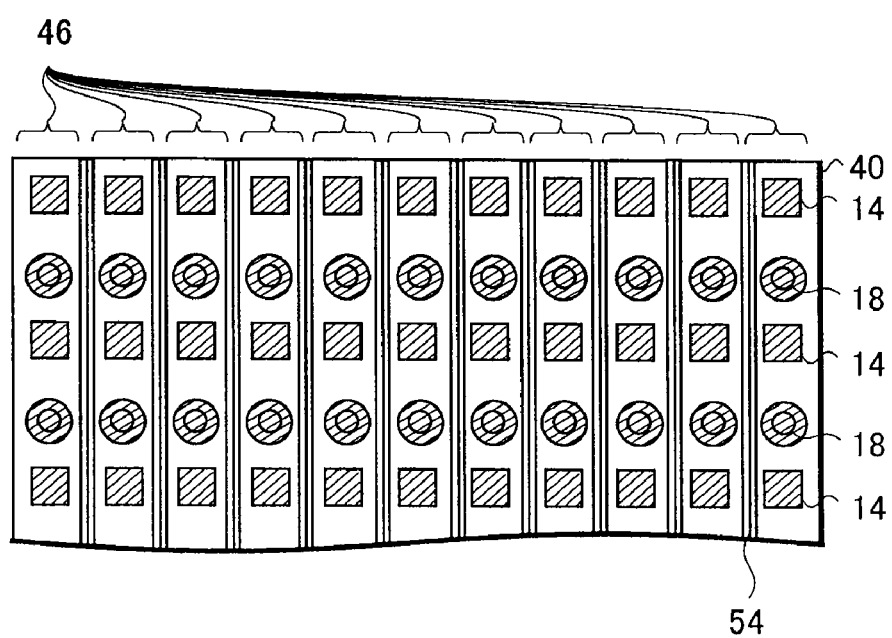
FIG. 8B is a plan view, for illustrating the method for manufacturing a light emitting module according to the preferred embodiment of the present invention.

Next, as shown in FIG. 8A and FIG. 8B, grooves for separation are formed between the two adjacent units 46. As shown in FIG. 8A, between the two adjacent units 46, a first groove 54 is formed from the upper surface of the substrate 40, and a second groove 56 is formed from the lower surface thereof. These two grooves have V-shaped cross sections.

Herein, the size (depth) of the first groove 54 may be the same as that of the second groove 56, or one may be formed to be larger than the other. Furthermore, it is possible to form only either the first groove 54 or the second groove 56, if this configuration does not cause any problem in later steps.

The first groove 54 and the second groove 56 are formed in a way that the substrate 40 is partially cut along the boundary between the two adjacent units 46 by revolving a cutting saw with a V-shaped cross section at a high speed. In this step, the substrate 40 is not separated into pieces by this cutting. Even after the grooves are formed, the substrate 40 is still a single plate.

In this embodiment, the two grooves described above are formed in the substrate 40 from which the insulating layer 42 has been removed in the preceding step. Thus, it is not necessary to cut the insulating layer extensively filled with the stiff fillers by the cutting saw. Thereby, wear of the cutting saw is suppressed, and the manufacturing cost is thus reduced.

Fourth Step: See FIG. 9A to FIG. 9C

In this step, an inner wall of the concave portion 18 is covered with a cover layers 34 made of a plating film.

Specifically, the substrate 40 made of the metal is energized as an electrode, and thereby cover layers 34 of plating films are adhered to the inner wall (the bottom surface 28 and the side surface 30) of the concave portion 18. As a material of the cover layers 34, gold, sliver, or the like is used. Meanwhile, in order to prevent the plating film from adhering to the surfaces of the first groove 54 and the second groove 56, the surfaces of these portions should be covered with a resist. In addition, since the back surface of the substrate 40 is covered with the oxide film 22 that is an insulator, the plating film does not adhere thereto.

In this step, by covering the concave portion 18 with the cover layer 34, the metal surface of the substrate 40 made of, for example, aluminium is prevented from being oxidized. Furthermore, if the cover layer 34 is a material, such as silver, superior in solder wettability, the light emitting element can be mounted with solder easily on the bottom surface 28 of the concave portion 18 in a step after the step of covering the bottom surface 28 with the cover layer 34. Still furthermore, the function of the side surface 30 of the concave portion 18 as a reflector is improved, by covering the side surface 30 with the cover layer 34 made of a material having a high reflectance.

Figure 9A:
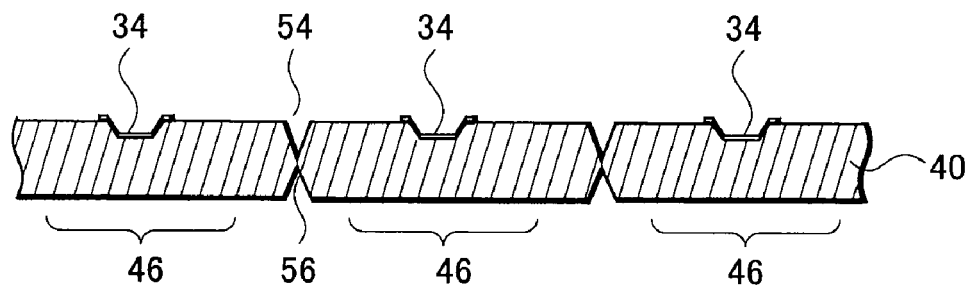
FIGS. 9A and 9B are cross-sectional views.
Figure 9B:
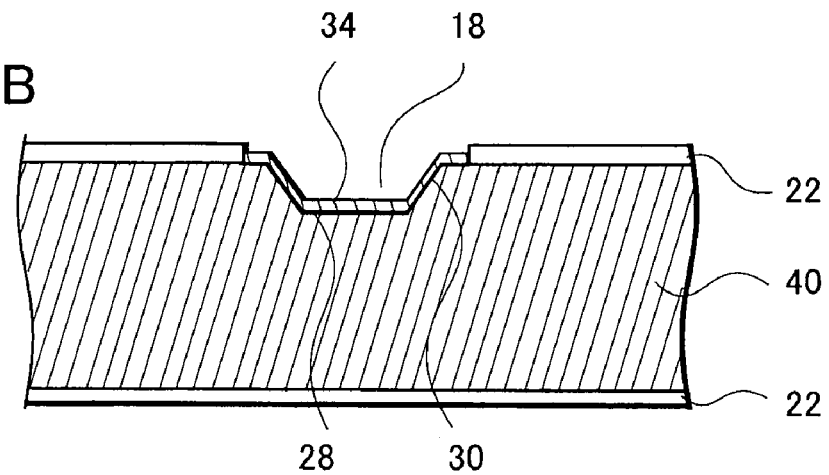
Figure 9C:
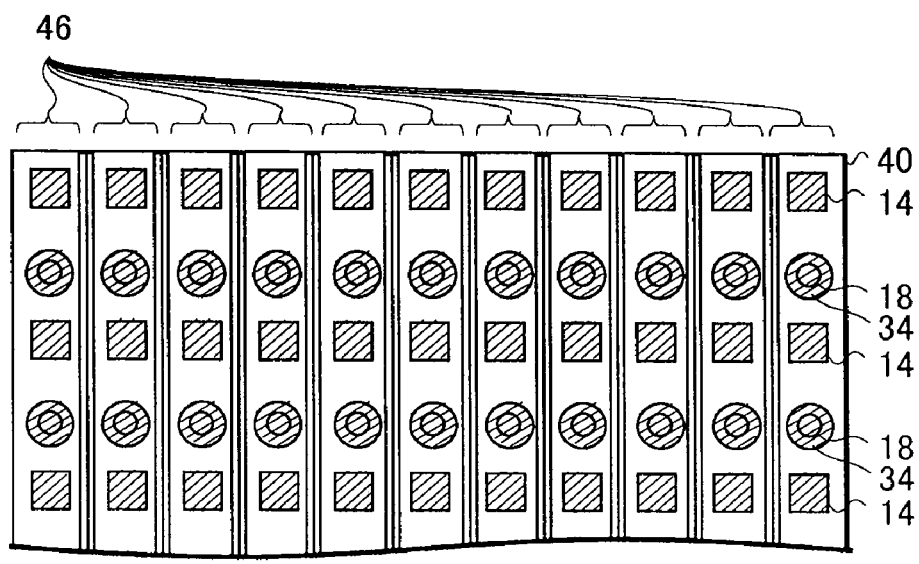
FIG. 9C is a plan view, for illustrating the method for manufacturing a light emitting module according to the preferred embodiment of the present invention.

Here, when the cover layer 34 covers only the concave portion 18 and the vicinity thereof by a plating process, the oxide film 22 covering the concave portion 18 and the vicinity therearound should be removed in advance to expose the metal surface of the substrate 40. Furthermore, as shown in FIG. 9C, the cover layer 34 may be formed on the upper surface of the substrate 40 except for the region where the conductive patterns 14 are formed (region covered by the insulating layer).

Fifth Step: See FIG. 10A to FIG. 10C

Figure 10A:
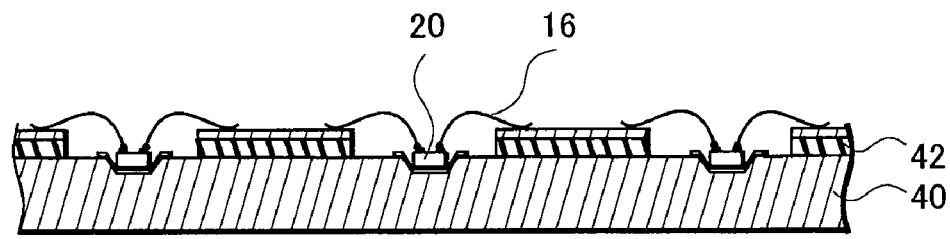
FIGS. 10A and 10B are cross-sectional views.
Figure 10B:
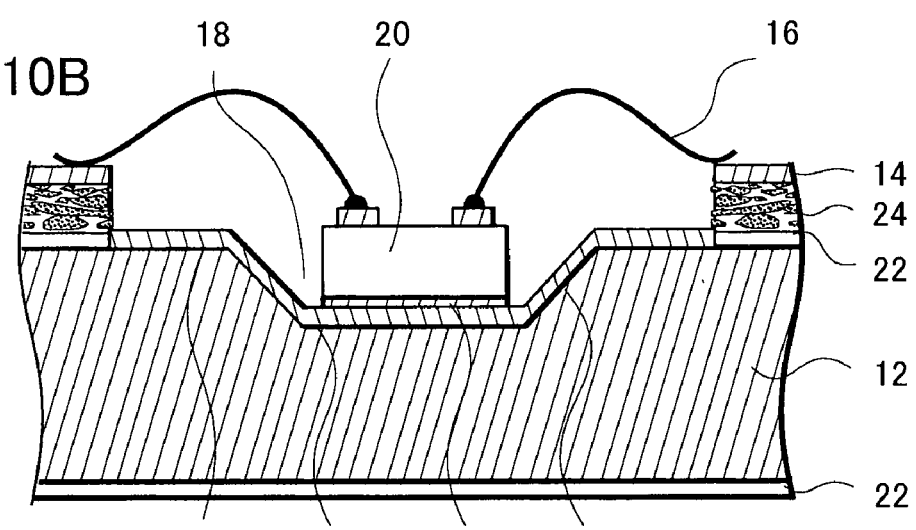
Figure 10C:
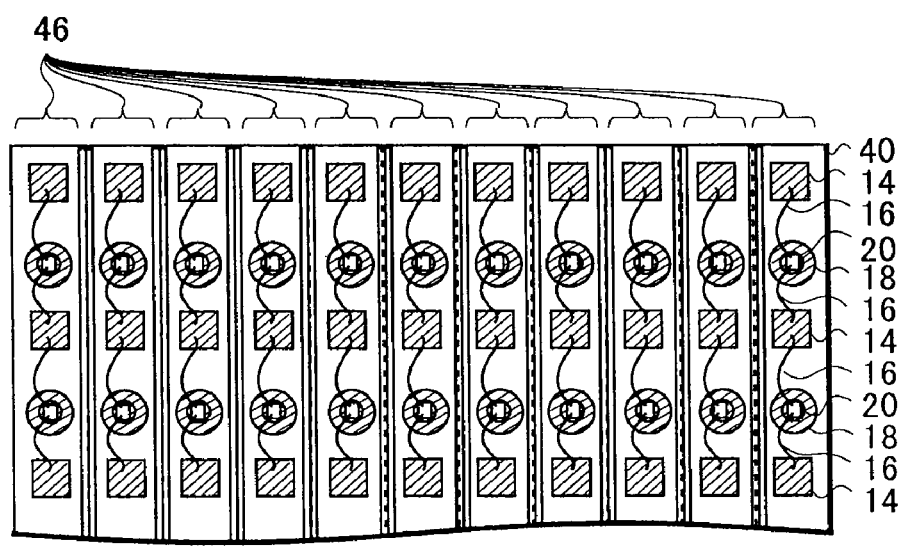
FIG. 10C is a plan view, for illustrating the method for manufacturing a light emitting module according to the preferred embodiment of the present invention.

Next, as shown in each drawing of FIG. 10A to FIG. 10C, light emitting elements 20 (LED chips) are mounted on the concave portions 18 of each unit 46 and the light emitting elements 20 are connected to conductive patterns. As shown in FIG. 10B, the lower surface of the light emitting element 20 is mounted on the bottom surface 28 of the concave portion 18 with a bonding material 26 interposed therebetween. Since the light emitting element 20 does not have an electrode on the lower surface thereof, any of a conductive adhesive material and an insulating adhesive which are made of resin can be employed as the bonding material 26. Moreover, as the conductive adhesive material, any of solder and a conductive paste is usable. Furthermore, the bottom surface 28 of the concave portion 18 is covered with the plating film, such as silver, superior in solder wettability. Thus, solder superior in thermal conductivity to an insulating material can be employed as the bonding material 26.

After the completion of fixedly attaching of the light emitting element 20, each electrode provided to the upper surface of the light emitting element 20 is connected to the conductive pattern 14 via a thin metal wire 16.

Sixth Step: See FIG. 11A to FIG. 11C

Figure 11A:
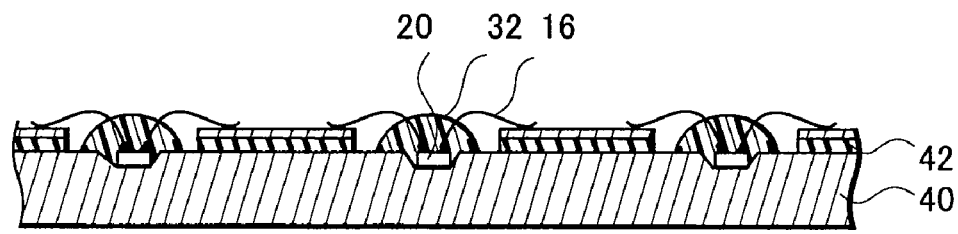
FIGS. 11A and 11B are cross-sectional views.
Figure 11B:
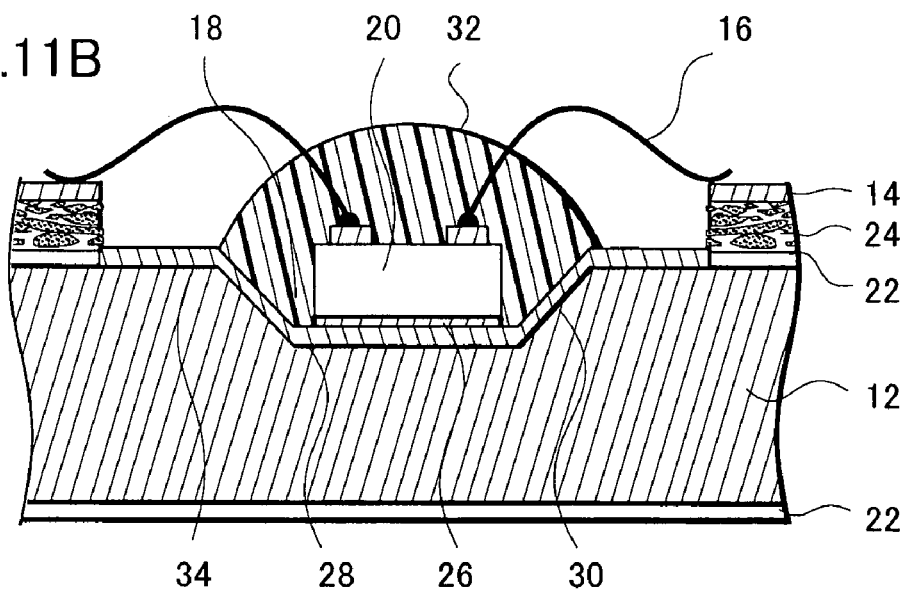
Figure 11C:
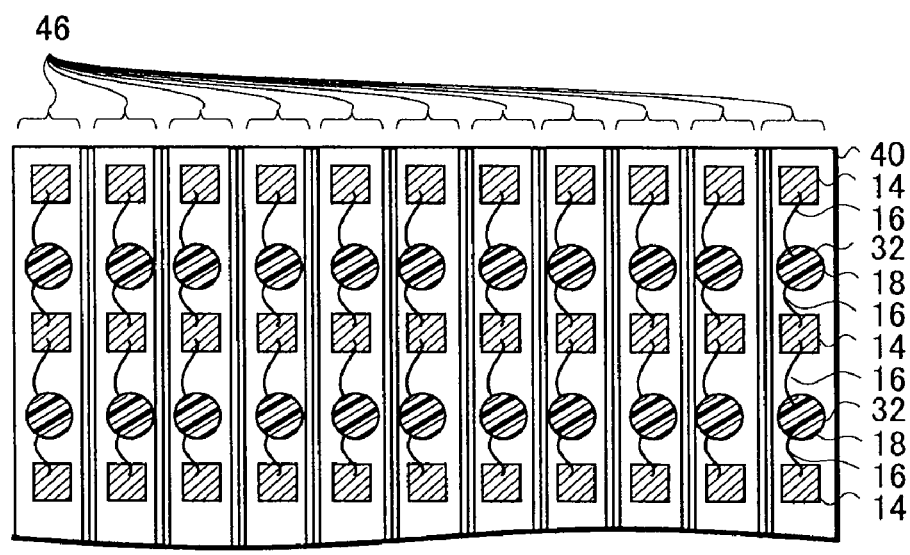
FIG. 11C is a plan view, for illustrating the method for manufacturing a light emitting module according to the preferred embodiment of the present invention.

Next, as shown in each drawing of FIG. 11A to FIG. 11C, the concave portions 18 formed in the substrate 40 for each unit 46 are filled with a sealing resin 32 to seal the light emitting elements 20. The sealing resin 32 is made of a silicone resin in which a fluorescent material is mixed. The sealing resin 32 in a state of liquid or semisolid is filled into the concave portion 18 and the opening portion 48, and then solidified. In this manner, the side surfaces and upper surface of the light emitting element 20 as well as a connecting portion between the light emitting element 20 and the thin metal wire 16 are covered with the sealing resin 32.

In this step, as each concave portion 18 is fed and sealed with the sealing resin 32 individually, the spreading of the fluorescent material included in the sealing resin 32 is suppressed in comparison with a case where a sealing resin 32 is formed on the entire upper surface of a substrate 40. Thus, uniformity in color of light emitted from the manufactured light emitting module is obtained.

Seventh Step: See FIG. 12A and FIG. 12B

Figure 12A:
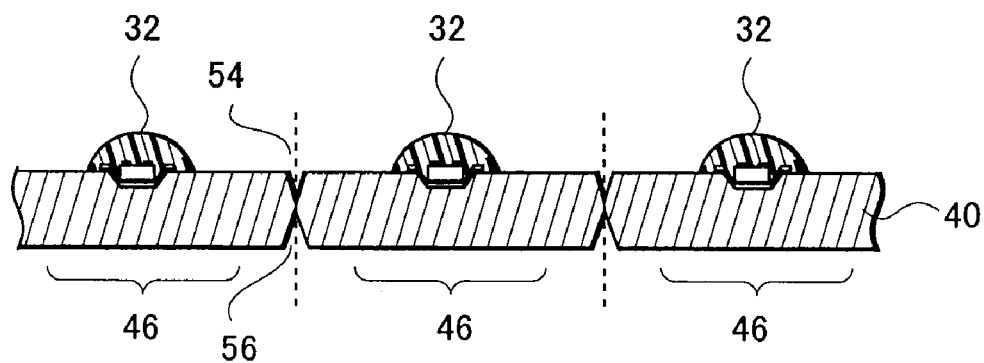
FIG. 12A is a cross-sectional view.
Figure 12B:
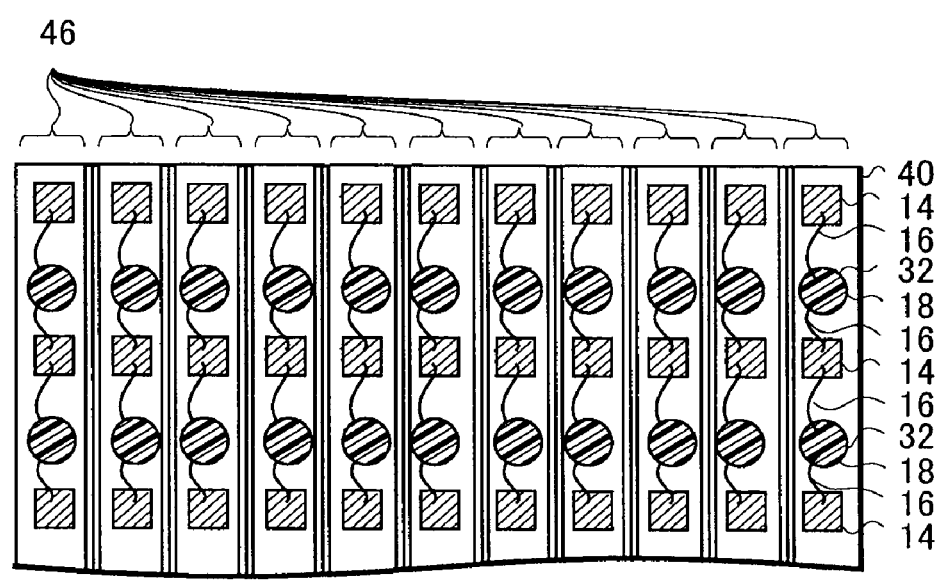
FIG. 12B is a plan view, for illustrating the method for manufacturing a light emitting module according to the preferred embodiment of the present invention.

Next, as shown in each drawing of FIG. 12A and FIG. 12B, the substrate 40 is separated to have units 46 at the positions where the first grooves 54 and the second grooves 56 are formed.

Since the two grooves 54 and 56 are formed between the two adjacent units 46, the substrate 40 is separated easily. As a way for this separation, usable are, for example, punching with a press, dicing, and bending of the substrate 40 at the positions where the two grooves are formed.

By performing the above-described steps, the light emitting module with the configuration shown in FIG. 1 is manufactured.

Here, the order of performing these steps can be changed. For example, the step of forming the first groove 54 and the like shown in FIG. 8A and FIG. 8B may be performed after the step of forming the sealing resin 32 shown in FIG. 11A to FIG. 11C. Furthermore, immediately after the step of patterning to form the conductive pattern 14 or the wiring layers as shown in FIG. 5A to FIG. 6D, a first groove 54 and the like may be formed, and a substrate 40 may be separated into individual units 46.

According to the preferred embodiments of the present invention, a portion of an insulating layer, on which a wiring layer is not formed, is removed. Accordingly, the upper surface of the remaining insulating layer is covered with the wiring layer. Thereby, the insulating layer is not irradiated with light emitting from a light emitting element. In this manner, the deterioration of the insulating layer due to the light thus emitted is suppressed, and consequently reduction in the breakdown voltage of the insulating layer does not occur over a long period.

What is claimed is:
1. A light emitting module comprising:
a circuit board;
an insulating layer disposed on the circuit board;
a metal wiring layer formed directly on the insulating layer; and a light emitting element disposed on the metal wiring layer so as to be physically connected to the metal wiring layer, wherein at least a portion of the insulating layer is removed in a region where the metal wiring layer is not formed, the entire top surface of the insulating layer that is not removed is covered by the metal wiring layer to form a stack of the metal wiring layer and the insulating layer, the stack of the metal wiring layer and the insulating layer is patterned to have at least a first portion and a second portion isolated from the first portion, and the circuit board is exposed between the first portion of the stack and a lateral edge portion of the circuit board and between the second portion of the stack and a lateral edge portion of the circuit board.

2. The light emitting module according to claim 1, wherein the entire insulating layer is removed except for a region where the metal wiring layer is formed.

3. The light emitting module according to claim 1, wherein the circuit board is a metal substrate made of a metal, and, in the region where the metal wiring layer is not formed, the insulating layer is removed so as to expose an upper surface of the metal substrate.

4. The light emitting module according to claim 1, wherein the circuit board comprises a substrate comprising a resin and a conductive film made of a metal and formed on the substrate.

5. The light emitting module according to claim 1, wherein the circuit board is made of aluminum.

6. The light emitting module according to claim 1, wherein the circuit board comprises a metal substrate and an oxide layer formed on the metal substrate.

7. The light emitting module according to claim 6, wherein the oxide layer is exposed in a region where the insulating layer is removed.

8. The light emitting module according to claim 1, further comprising another light emitting element disposed on the metal wiring layer, wherein the metal wiring layer is patterned so that a portion of the patterned metal wiring layer is used to electrically connect the light emitting element and the another light emitting element, and the insulating layer is removed between the light emitting element and the another light emitting element.

9. The light emitting module according to claim 1, further comprising a bonding material bonding a bottom surface of the light emitting element to the metal wiring layer.

10. The light emitting module according to claim 1, wherein the insulating layer comprises fillers mixed therein.

* * * * *